United States Patent [19]
Daoud

[11] Patent Number: 6,104,805
[45] Date of Patent: *Aug. 15, 2000

[54] SWIVEL CABLE MOUNTING ARRANGEMENT REQUIRING NO WIRING FEED THROUGH HOLE

[75] Inventor: Bassel Hage Daoud, Parsippany, N.J.

[73] Assignee: Lucent Technologies, Inc., Murray Hill, N.J.

[ * ] Notice: This patent is subject to a terminal disclaimer.

[21] Appl. No.: 09/102,938

[22] Filed: Jun. 23, 1998

[51] Int. Cl.⁷ ...................................................... H04M 5/00

[52] U.S. Cl. ............................ 379/328; 379/331; 439/49; 361/104; 361/622

[58] Field of Search ................................ 439/49, 50, 621; 361/57, 58, 91, 103, 104, 111, 117, 124, 626, 628, 630, 622, 627, 91.1; 379/326–328, 330, 331

[56] References Cited

U.S. PATENT DOCUMENTS

| | | | |
|---|---|---|---|
| 4,516,818 | 5/1985 | Johnston et al. | 439/135 |
| 4,731,501 | 3/1988 | Clark et al. | 174/65 R |
| 5,363,440 | 11/1994 | Daoud | 379/399 |

*Primary Examiner*—Ronald W. Leja
*Attorney, Agent, or Firm*—Gibbons, Del Deo Dolan, Griffinger Evecchione

[57] ABSTRACT

A building entrance protector swivel cable mounting arrangement without a feed through hole requirement has an output wire termination device, a barrier wall comprises a fire-resistant plate for isolating the swivel cable from the output wire termination device within the building entrance protector. The fire-resistant plate has a narrow opening comprised of a primary aperture and a wiring access slot. The wiring access slot permits insertion of terminated individual wiring into the primary aperture. A method in accordance with the present invention is also described.

14 Claims, 4 Drawing Sheets

SWIVEL CABLE MOUNTING ARRANGEMENT REQUIRING NO WIRING FEED THROUGH HOLE

CROSS REFERENCE TO RELATED APPLICATIONS

This application is related to copending U.S. patent application Ser. No. 09/103,238 filed on Jun. 23, 1998, entitled "WIRING PROTECTION AND RETENTION ARRANGEMENT WITHOUT FEED THROUGH" having common inventors and a common assignee.

FIELD OF THE INVENTION

The present invention relates to building entrance protectors for telecommunication lines, and more particularly to the wiring systems for connecting components of the entrance protectors.

BACKGROUND OF THE INVENTION

Building entrance protector (BEP) is the name used in the art of telephone equipment to describe the junction box where telephone lines from outside plant wiring are joined to customer premises equipment. In the most common application, the building entrance protector is the place where the telecommunication lines from an outside plant wiring enter a building and are joined to the communication system within that building. Within the building entrance protector there is an input wire termination device that receives the telecommunication lines contained within the outside plant wiring. Also contained within the building entrance protector is an output wire termination device that receives the telecommunication lines required for the customer premises equipment. Located in between the input wire termination device and the output wire termination device, passing through a barrier wall, are fusible links. The fusible links are typically 26 gauge copper wire, which is thinner than the gauge of either the outside plant wiring or the customer premises equipment.

The purpose of the fusible links is to prevent power surges from passing through the building entrance protector that can damage equipment located within the building or melt any wire on the customer side of the building entrance protector. Since telecommunication lines are frequently located on the same poles as power lines, a break in a power line that subsequently contacts a telephone line, can result in a large surge of power passing through the telecommunication lines into a building. Similarly, lightning strikes can result large surges of power pass in through telecommunication lines into a building. The purpose of the building entrance protector is to ensure that any such power surge is stopped at the point of the building entrance protector and is thus prevented from traveling into the building where it can cause damage to equipment and possibly a fire.

Wires of swivel cables are normally fed through a mounting hole before terminating on a connector. Typical wiring connections are made by hand or using hand tools. The swivel bracket is held onto the mounting hole by a "C" clamp. The housing where the mounting hole is typically located can make the wiring process extremely difficult as the housing may be in the way of the wiring operator.

Accordingly, there is a need for wires of a swivel cable to be terminated on a connector before being fed through a mounting hole.

SUMMARY OF THE INVENTION

The present invention is a building entrance protector swivel cable mounting arrangement without a feed through hole requirement. In the building entrance protector having an output wire termination device, a barrier wall comprises a fire-resistant plate for isolating the swivel cable from the output wire termination device within the building entrance protector. The fire-resistant plate has a narrow opening comprised of a primary aperture and a wiring access slot. The wiring access slot permits insertion of terminated individual wiring into the primary aperture. A method in accordance with the present invention is also described.

BRIEF DESCRIPTION OF THE DRAWINGS

A more complete understanding of the present invention may be obtained from consideration of the following description in conjunction with the drawings in which.

DETAILED DESCRIPTION OF VARIOUS ILLUSTRATIVE EMBODIMENTS

Although the present invention is particularly well suited for use with a building entrance protector (BEP) and shall be described in that respect herein, it is equally well suited for other devices to which a swivel stub cable is terminated.

Figure 1:
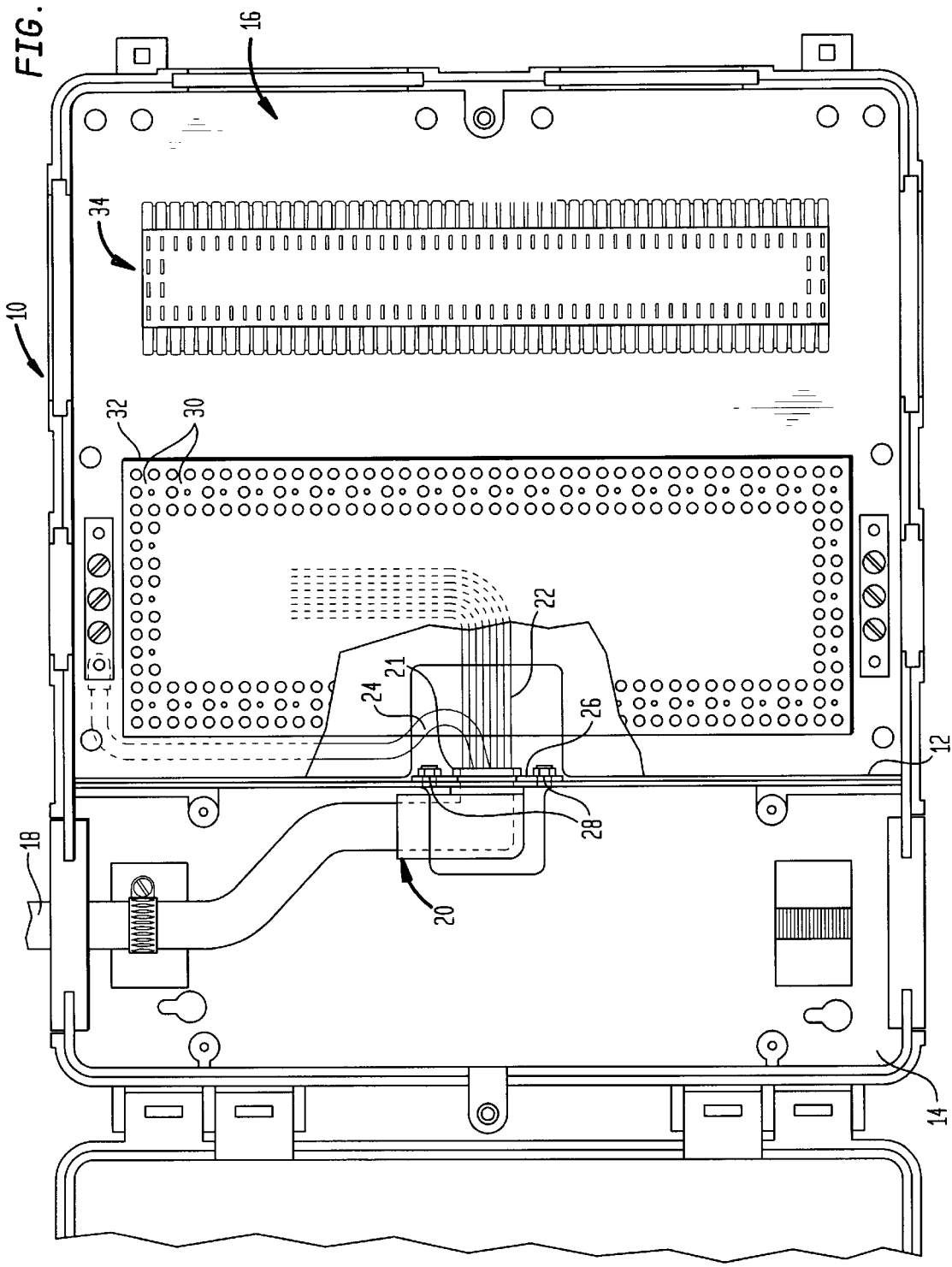
FIG. 1 is a top view of a building entrance protector (BEP) for swivel cable mounting arrangement without a feed through hole requirement.

Referring to FIG. 1, there is shown the present invention building entrance protector (BEP) for swivel cable mounting arrangement without a feed through hole requirement 10. The BEP for swivel cable without feed through 10 contains a fire-resistant barrier wall 12 which separates a sealed fire-resistant splice chamber 14 and a distribution chamber 16. Wiring cable 18 passes into the sealed fire-resistant splice chamber 14. The wiring cable 18 passes through a swivel cable head 20 located within the sealed fire-resistant splice chamber 14. The wiring cable is composed of individual fusible links 22. A ground lead 24 is electrically connected to the swivel cable head 20 and is coupled to the BEP for swivel cable without feed through 10 in the distribution chamber 14. A retaining bracket 26 holds the swivel cable head 20 in place. The retaining bracket 26 is attached to the fire-resistant barrier wall 12 by fasteners 28. An individual fusible link 22 from the wiring cable 18 is connected to a corresponding individual surge protector port 30 located on a surge protector panel 32. The individual surge protector ports 30 are coupled to an output wire termination device 34, such as a punch down block. Customer premise equipment is connected to the output wire termination device 34.

Figure 2:
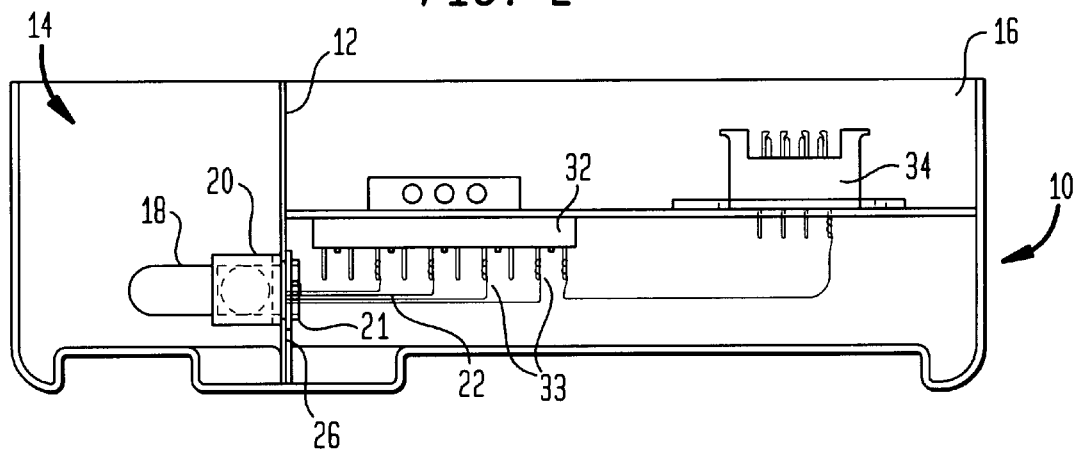
FIG. 2 is a cross sectional view of the BEP for swivel cable mounting arrangement.

Referring to FIG. 2, which is a cross-sectional view of the BEP for swivel cable without feed through 10 shown in FIG. 1, it can be seen that the fusible links 22 extend through a narrow opening 34 in the fire-resistant barrier wall 12 which separates the sealed fire-resistant splice chamber 14 and the distribution chamber 16 and connect to terminals 33 on the bottom of the surge protector panel 32. The swivel cable head 20 partially passes through the fire-resistant barrier wall 12 and is captured by the retaining bracket 26 which slips between the fire-resistant barrier wall 12 and a lip 21.

Figure 3A:
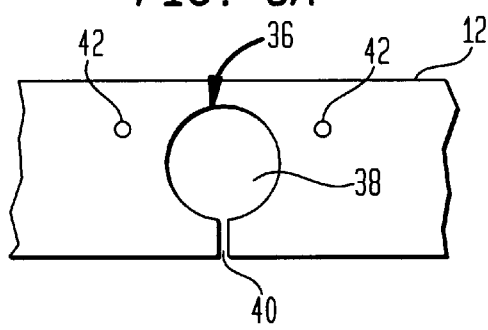
FIG. 3a, 3b and 3c shows details of swivel cable mounting components.
Figure 3B:
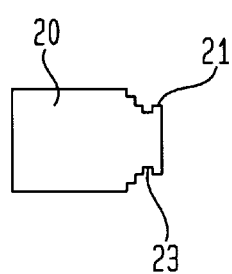
Figure 3C:
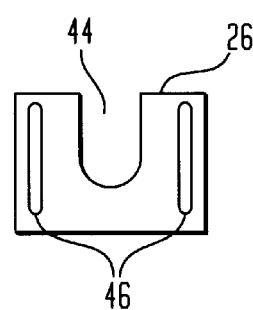

Referring to FIGS. 3a, 3b and 3c together, there are shown details of the swivel cable head 20 mounting. In FIG. 3a there is shown a narrow opening 36 in the fire-resistant barrier wall 12 which separates the sealed fire-resistant splice chamber 14 and the distribution chamber 16. The narrow opening 36 is comprised of two portions, a primary aperture 38 and a wiring access slot 40. In FIG. 3b there is shown a detail end view of the swivel cable head 20, showing the lip 21 and a groove 23. The lip 21 is smaller than the main body of the swivel head and is small enough so that it can fit through the primary aperture 38. Referring to FIG. 3c there is shown a detail view of the retaining bracket 26. The retaining bracket has an open capture slot 44 and fastener slots 46. The Open capture slot is smaller in width than the lip 21 but large enough to slip over the groove 23.

Figure 4C:
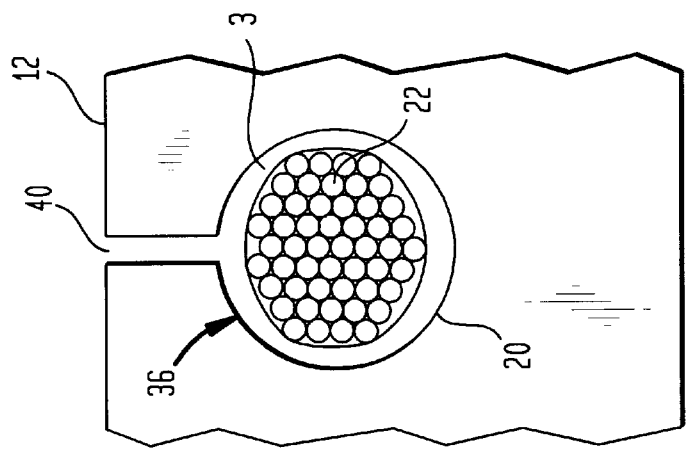
FIG. 4a, 4b and 4c show a sequence of insertion of terminated fusible links into the narrow opening.
Figure 4B:
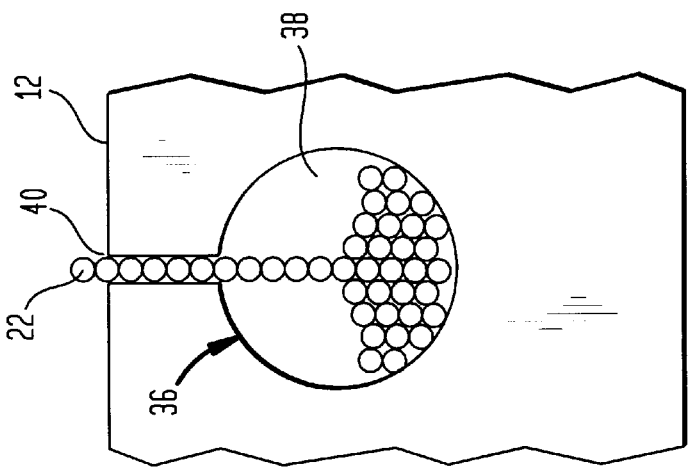
Figure 4A:
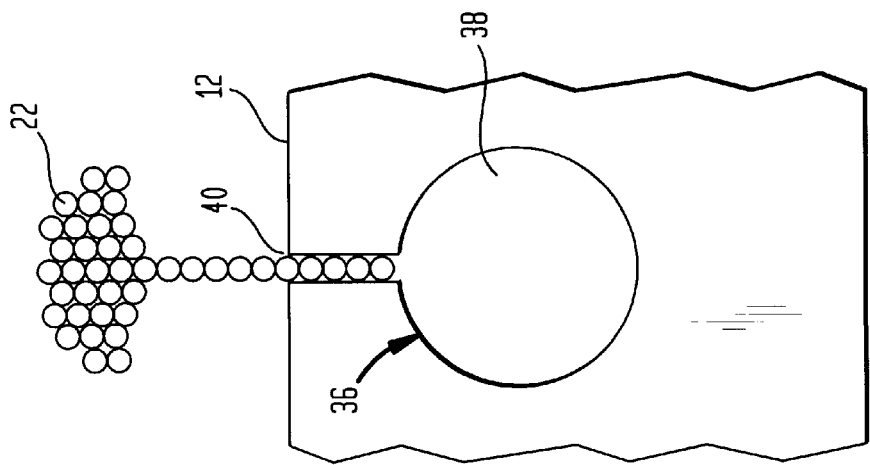

The fusible link 22 (shown in FIGS. 1 and 2) connects an individual wire from the wiring cable 18 to a corresponding individual surge protector port 30 located on a surge protector panel 32. Utilizing a power wire-wrapping device, or other suitable wire termination device, the fusible links 22 are connected to individual terminal leads 33 on the bottom of the surge protector panel 32. After the termination of the ends of the fusible links 22, the fusible links 22 must extend through the narrow opening 36 in the fire-resistant barrier wall 12 which separates the sealed fire-resistant splice chamber 14 and the distribution chamber 16. Referring to FIGS. 4a, 4b and 4c, there is shown a sequence of inserting the fusible links 22 into the narrow opening 36 after termination. Referring to FIG. 4a the terminated fusible links 22 are inserted into the wiring access slot 40, which is at least as wide as a single fusible link 22. It can be seen in FIG. 4b, that the fusible links 22 collect in the primary aperture 38. After all of the corresponding fusible links 22 have been collected in the primary aperture 38, the swivel cable head 20 is inserted into the primary aperture 38 and the retaining bracket 26 is slipped over the groove 23 and fastened in place.

Figure 5:
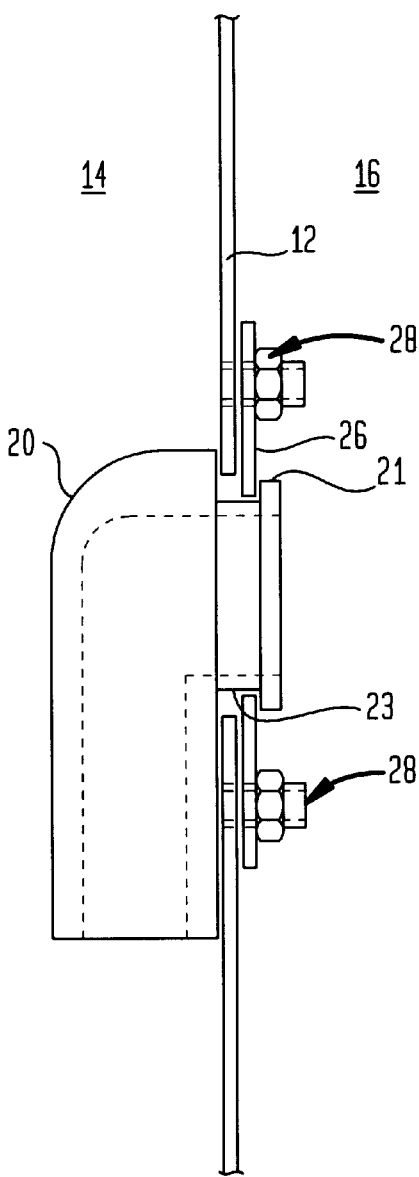
FIG. 5 shows an edge view of swivel mounting components installed in the fire-resistant barrier wall; and, FIG. 6a and 6b show an alternative embodiment spring retainer.

Referring to FIG. 5, there is shown an edge view of the fire-resistant barrier wall 12 with the swivel cable head 20 attached. Retaining bracket 26 is held in place by fasteners 28. The retaining bracket fits over the groove 23 between the lip 21 and the fire-resistant barrier wall 12.

Figure 6A:
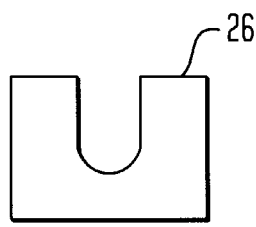
Figure 6B:
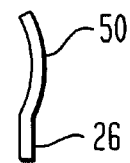

While the retaining bracket 26 is shown for use with fasteners 28 (shown in FIG. 1), other alternative embodiments include other methods of fastening the retainer bracket, including that shown in FIG. 6a and 6b where the retainer bracket 26 acts as a spring element. By bending or compressing the curved spring portion 50 of the retainer bracket 26 under the lip 21, the retainer bracket 26 will snap in place to capture the swivel cable head 20 to the fire-resistant barrier wall 12.

Numerous modifications and alternative embodiments of the invention will be apparent to those skilled in the art in view of the foregoing description. This includes but is not limited to the type of retaining bracket and associated fasteners. Accordingly, this description is to be construed as illustrative only and is for the purpose of teaching those skilled in the art the best mode of carrying out the invention. Details of the structure may be varied substantially without departing from the spirit of the invention and the exclusive use of all modifications which come within the scope of the appended claim is reserved.

What is claimed:

1. A building entrance protector assembly for connecting a swivel cable head holding wiring elements to customer premises wiring, the building entrance protector assembly comprising:

a chamber;

an output termination device for connecting to the customer premises wiring, said output termination device removable from said chamber;

a barrier wall having a primary aperture and a wiring access slot having a width generally equal to the diameter of at least one of said wiring elements, which permits the wiring elements to be passed individually through said slot, said barrier wall disposed within said chamber and dividing said chamber and separating said output termination device from said swivel cable head;

retaining means for retaining the swivel cable head to said barrier wall and for maintaining integrity of said barrier wall;

wherein the wiring elements from the swivel cable head can be connected to said output termination device without having to first feed through said primary aperture prior.

2. The building entrance protector assembly as recited in claim 1 wherein said barrier wall is comprised of a fire-resistant material.

3. The building entrance protector assembly as recited in claim 1 wherein said retaining means comprises a slotted bracket.

4. The building entrance protector assembly as recited in claim 1 wherein said primary aperture is defined by a circular shape.

5. The building entrance protector assembly as recited in claim 1 wherein said retaining means comprises a spring slotted bracket.

6. The building entrance protector assembly as recited in claim 1 further comprising a surge connector port wherein the wiring elements are connected to said output termination device through said surge connector port.

7. The building entrance protector assembly as recited in claim 6 wherein said surge connector port is separated from said swivel cable head by said barrier wall.

8. A method of connecting a swivel cable head holding wiring to an output termination device in a building entrance protector assembly, said building entrance protector assembly including a chamber, the method comprising the steps of:

providing a swivel cable head having individual wiring elements;

terminating said individual wiring elements to a connector of a connector port;

passing said individual wiring elements individually through a wiring access slot having a diameter generally equal to at least one of said individual wiring elements into a primary aperture in a barrier wall, said barrier wall disposed within said chamber and dividing said chamber;

retaining the swivel cable head in said primary aperture with retaining means; and maintaining integrity of said barrier wall with said retaining means;

wherein said individual wiring elements are contained within the swivel cable head and said primary aperture.

9. The method as recited in claim 8 wherein said barrier wall is comprised of a fire-resistant material.

10. The method as recited in claim 8 wherein said retaining means is a retaining bracket.

11. The method as recited in claim 8 wherein said retaining means is a spring bracket.

12. In a building entrance protector having an swivel cable head with individual wiring and an output wire termination device, a barrier wall for isolating the swivel cable head from the output wire termination device, the barrier wall comprising:

a fire-resistant plate for isolating the swivel cable head from the output wire termination device within the building entrance protector, said fire resistant plate having a narrow opening;

said narrow opening having a primary aperture and a wiring access slot having a width generally equal to the diameter of at least one of said individual wiring;

retaining means for capturing the swivel cable head to said barrier wall and for maintaining integrity of said barrier wall;

wherein said wiring access slot permits insertion of said individual wiring individually into said primary aperture.

13. The barrier wall in a building entrance protector as recited in claim 12 wherein said barrier wall is comprised of a fire-resistant material.

14. The barrier wall in a building entrance protector as recited in claim 12 wherein said primary aperture is defined by a circular shape.

* * * * *